United States Patent

Chan et al.

(10) Patent No.: US 6,350,321 B1
(45) Date of Patent: Feb. 26, 2002

(54) UHV HORIZONTAL HOT WALL CLUSTER CVD/GROWTH DESIGN

(75) Inventors: Kevin K. Chan, Staten Island; Christopher P. D'Emic, Ossining; Raymond M. Sicina, Florida; Paul M. Kozlowski, Hopewell Junction; Margaret Manny, Mahopac; Sandip Tiwari, Ossining, all of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/207,353

(22) Filed: Dec. 8, 1998

(51) Int. Cl.[7] .............................................. C23C 16/00
(52) U.S. Cl. ...................................... 118/719; 156/345
(58) Field of Search .......................... 118/719; 29/25.1; 156/345; 204/298.25, 298.35; 438/907, 908

(56) References Cited

U.S. PATENT DOCUMENTS

| | | | | |
|---|---|---|---|---|
| 4,486,461 A | * | 12/1984 | Ito et al. ........................ 427/38 |
| 4,883,020 A | * | 11/1989 | Kasai et al. ................. 118/719 |
| 5,020,475 A | * | 6/1991 | Crabb et al. ................. 118/719 |
| 5,259,881 A | * | 11/1993 | Edwards et al. ............ 118/719 |
| 5,292,393 A | * | 3/1994 | Maydan et al. ............. 156/345 |
| 5,628,828 A | * | 5/1997 | Kawamura et al. ........ 118/719 |
| 5,695,564 A | * | 12/1997 | Imahashi ..................... 118/719 |
| 5,769,588 A | * | 6/1998 | Toshima et al. ............ 414/217 |
| 5,873,942 A | * | 2/1999 | Park et al. ................... 118/719 |
| 5,900,105 A | * | 5/1999 | Toshima ...................... 156/345 |
| 5,944,940 A | * | 8/1999 | Toshima ...................... 156/345 |
| 6,034,000 A | * | 3/2000 | Heyder et al. .............. 438/907 |
| 6,042,623 A | * | 3/2000 | Edwards ..................... 29/25.01 |
| 6,056,849 A | * | 5/2000 | Straemke .................... 156/345 |

* cited by examiner

Primary Examiner—Gregory Mills
Assistant Examiner—Luz Alejandro
(74) Attorney, Agent, or Firm—Casey P. August; Jon A. Gibbons; Fleit, Kain, Gibbons, Gutman & Bongini P.L.

(57) ABSTRACT

A cluster system controls the interface properties of the films that deposit or grow on a silicon substrate. The system comprises a plurality of horizontal quartz chamber or tubes each of which can hold a large quantity of wafers, a transfer chamber and a load/unload chamber. Several process steps can be executed sequentially in different tubes without intermediate exposure to ambient air. A transfer chamber connects them and allows wafer transportation from one tube to another in an absolute controlled UHV environment which limits any contamination such as $H_2O$, to less than a monolayer level. In addition, each tube can be pumped down to UHV pressure regime to avoid further cross contamination between tubes or particle generation. Since some of the process requires elevated temperature, all wafers are placed vertically on the quartz boat to prevent any wafer sagging as in a vertical furnace. Furthermore, before any wafers are placed into the transfer chamber, they are loaded into a load/unload chamber, which is the sole connection to the ambient air, to be purged and pumped so as to minimize particles and contamination.

14 Claims, 3 Drawing Sheets

UHV HORIZONTAL HOT WALL CLUSTER CVD/GROWTH DESIGN

CROSS-REFERENCE TO RELATED APPLICATIONS

Not applicable

BACKGROUND OF THE INVENTION

1. Field of the Invention

The invention disclosed broadly relates to the field of processing semiconductor wafers, and more particularly relates to the field of ultra high vacuum (UHV) processing of batches of semiconductor wafers or films.

2. Description of the Related Art

In the last decade dynamic random access memories (DRAM's) have been established as the driving force for increasing integration density in VLSI circuits and pushing silicon technology towards submicron devices. The consequence has been a demand on thinner semiconductor films with lower defect density and higher yield. However, as the films get thinner, the interfaces of such films are frequently a determining factor of the device performance or the yield of transistors. To improve these thin film properties, one must not only have great understanding of the interface properties of films but must so be able to control and monitor them. Currently, most of the existing batch tool sets in the whole semiconductor industry are single hot wall tubes for dielectric growth/deposition. Each dielectric film, as it comes out from processing tubes, immediately contacts atmospheric environment, (i.e., air, water vapor and particles) and the interface of this film is contaminated quickly. For example, a thermally grown 20 A (Angsrom) gate oxide is contaminated by water vapor and particles in the air when it is transferred from the oxide furnace to others before poly-Si gate is deposited. Furthermore, because this gate oxide is so thin, both contaminated interfaces (Si/oxide and oxide/poly-Si interfaces) play a crucial role in the electrical characteristics of devices. Thus, the resulting device performance and yield are likely to be poor. An integrated in situ cluster tool is needed to avoid all the contamination issues. Applied Materials Inc., of Santa Clara Calif. recently marketed a Centura Cluster tool with three chambers to deal exclusively with these film interface contamination issues so that device performance and yield can be enhanced. However, there are several shortcomings in this system design. To begin, the chamber is a single wafer chamber using at least one heat lamp design which does not produce very uniform heating. A more uniform heating method is required. In addition, the design of the Centura Cluster tool consists of a continuous rotating chuck to rotate the wafer so as to improve heat uniformity across the wafer, however, this increases the chance of particle generation. Therefore, a need exists to provide an in situ cluster tool to overcome this problem.

Another potential problem with integrated cluster tools is wafer thermal shock when processed at 700 to 1000 degrees Celsius then transported by a cold transfer mechanism causing thermal cracking of wafers. These high process temperatures combined with use of larger wafer sizes, such as 12 inches, produces wafer sagging and warping. In addition, rapid change of temperature induces stress in films causing degradation of the device's performance. Other in situ providers of integrated equipment have used vertical furnaces but process temperature between 1100–1350 degrees Celsius can produce wafer sagging and warping. Accordingly, a need exists to provide an in situ cluster tool to overcome this sagging problem.

Still, another shortcoming with present integrated cluster tools is the environment used to transfer wafers between processing chambers. The environment, or more specifically the pressure in this environment, is too high. It is common for this pressure to be in the range of 1–760 torr, so contamination such as $H_2O$ and $O_2$ still occurs at these higher pressure levels. Therefore, a need exists to overcome this contamination problem during the transfer of wafers between processing chambers.

Yet, still another shortcoming with present integrated cluster tools is that an atmospheric furnace equivalent oxidation chamber is not offered. Without such an oxidation chamber, a complete transistor gate stack formation can not be fabricated in one tool. Accordingly, a need exists for a batch processing system that overcomes the above problems.

SUMMARY OF THE INVENTION

A semiconductor cluster tool for executing several process steps such as CVD, Growth and Oxidation sequentially without intermediate exposure to ambient air. A UHV transfer chamber connects a plurality of UHV process chambers with an UHV transfer mechanism to enable the growth of a complete gate stack. The vacuum in each processing chamber can be matched to the pressure of the transfer chamber to reduce exposure to contaminates such as $H_2O$ and other particles to less than a monolayer. Furthermore, before any wafers are placed into the transfer chamber, they are loaded into an UHV load/unload chamber, which is the sole connection to the ambient air. The UHV load/unload chamber can be purged and pumped so as to minimize particles and contamination.

DETAILED DESCRIPTION OF AN EMBODIMENT

Glossary of Terms Used in this Disclosure

CVD—Chemical Vapor Deposition.
LP—Low Pressure acronym typically in the range of $10^{-4}$ torr.
UHV—Ultra High Vacuum acronym typically in the range of $10^{-8}$ torr.
UUHV—Ultra Ultra High Vacuum acronym typically in the range of $10^{-10}$ torr.

Description

Figure 1:
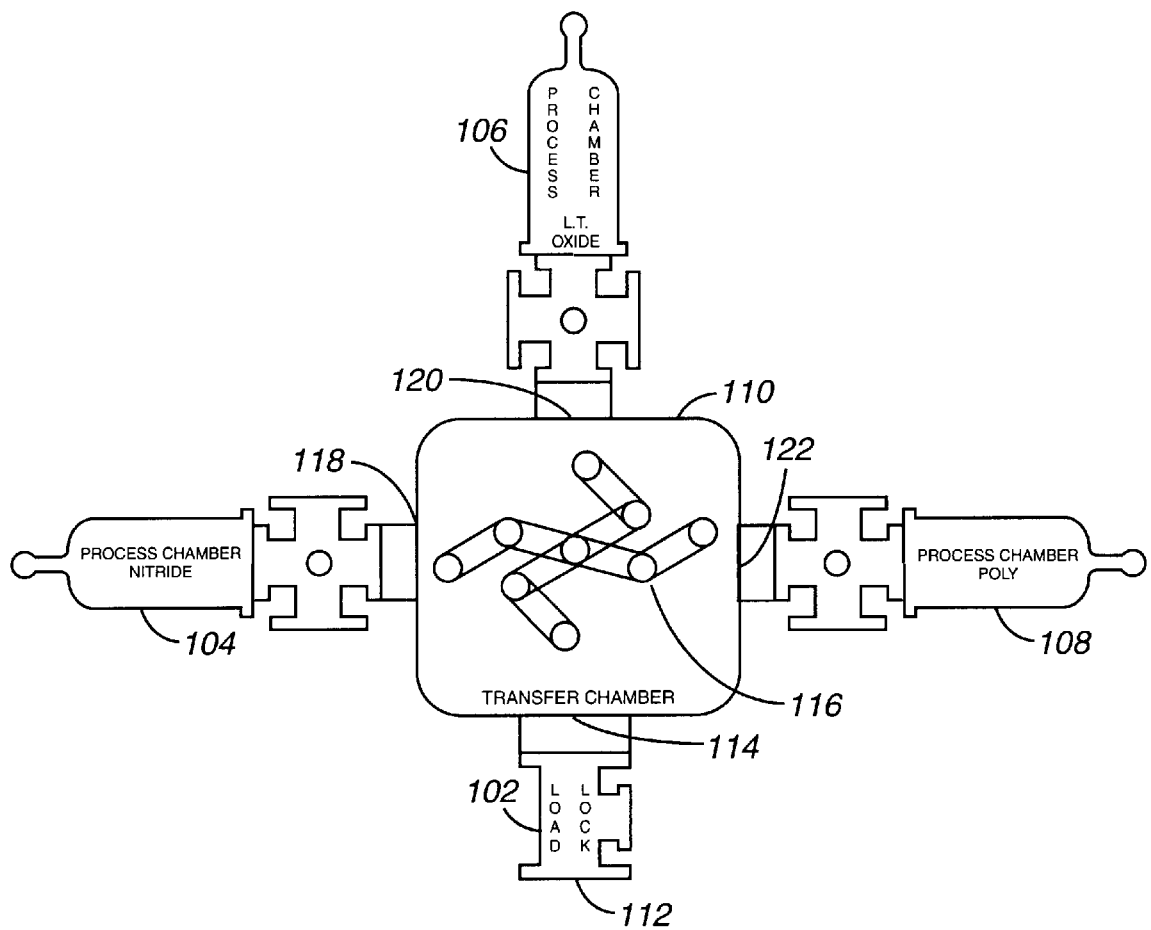
FIG. 1 is a block diagram of a semiconductor wafer cluster processing system according to the present invention.

Referring now to FIG. 1, is a block diagram of an UHV semiconductor wafer cluster processing system 100 according to the present invention. In the preferred embodiment, five chambers are shown. The five chambers are as follows: (i) a load/unload (load lock) chamber 102; (ii) nitride process chamber 104; (iii) oxide process chamber 106; (iv) poly process chamber 108; and (v) transfer chamber 110. Four chambers—load/unload chamber 102, nitride process chamber 104, oxide process chamber 106, and poly process chamber 108—are connected to a transfer station chamber 110. Other chambers can be added as the process requires and now these five chambers will be described in greater detail. It is important to understand that each chamber can be isolated from the transfer chamber 110 through the use of pressure isolation doors discussed below. As a batch of wafers is moved through the system 100, the pressure in each chamber can be matched to that pressure of the transfer station chamber 110 to minimize contamination through pressure differentials and temperature differentials. The pressure in the transfer station chamber 110 is an UHV to an UUHV in this embodiment. For convenience, this pressure will be referred to as the Standard Pressure. An entire gate stack can be fabricated without exposing the wafers to any contaminates such as water. The process in system 100 can cover the fabrication of a variety of semiconductor devices including CMOS, BiCMOS, Bipolar, SiGe hetro-junction devices, epitaxial SiGe devices and others devices fabricated under UHV and UUHV.

The process begins with the placement of a batch of wafers to be processed on a quartz boat. The wafer can be an 8 inch wafer or a 12 inch wafer. In this embodiment, the wafers are placed vertically on the quartz boat to reduce sagging when the wafers are processed at elevated temperatures. The load/unload chamber 102 has two doors for isolating the pressure in the load/unload chamber 102. The first pressure-isolating door 112 connects the load/unload chamber 102 to the ambient environment surrounding the system 100. The second pressure-isolating door 114 connects the transfer chamber 110. The first pressure-isolating door 112 is opened and the quartz boat holding the wafers is inserted into the load/unload chamber 102. Pressure-isolating door 112 is closed. The ambient air in the load/unload chamber 102 is removed through a vacuum pump (not shown). The vacuum pump is described further below. The pressure in the load/unload chamber 102 is reduced to the Standard Pressure. Once the pressure in the load/unload chamber 102 is stabilized to the pressure in the transfer chamber 110, a preparation process is begun. The preparation process consists of desorbing oxygen or hydrogen containing contaminants on the wafers by purging the wafers with helium. Once the wafer preparation step is complete, the pressure in the load/unload chamber is check to make sure it matches the Standard Pressure of the transfer chamber 110 and the second pressure-isolating door 114 is opened.

At this point in the process, the boat of wafers can be moved to any other chamber in the system 100. The exact sequence of the boat movement will depend on the device being fabricated and the types and locations of the process chambers. As an illustration, the process of fabricating a gate stack will be discussed.

A servo controlled mechanical transfer system 116 in the transfer chamber 110 moves the boat to the oxide process chamber 106. A pressure-isolating door 120 to the oxide process chamber 106 is opened when the pressure in the oxide process chamber 106 is matched to the Standard Pressure of the transfer chamber 110. Next, the boat holding the wafers is transferred inside the oxide process chamber 106 and the pressure-isolating door 120 is closed and the oxide process begins. The oxide process grows an oxide on the wafers. In this embodiment the oxide is grown at 900 degrees Celsius and a 7 to 30 Angstrom oxide layer is formed. After the oxide process is complete, the pressure in the oxide chamber 106 is checked to make sure it matches the Standard Pressure of the transfer chamber 110, then the pressure-isolating door 120 is opened.

The pressure in the nitride chamber 104 is matched to the pressure of the transfer chamber 110. The transfer system 116 moves the boat to the nitride process chamber 104. The pressure inside the nitride chamber 104 is adjusted to match the Standard Pressure of the transfer chamber 110. A pressure-isolating door 118 connecting the nitride process chamber 104 to the transfer chamber 110 is opened. The boat holding the wafers is transferred into the nitride chamber 104. The pressure-isolating door 118 is closed. An extremely thin layer of nitride in the range of 5 Angstroms is formed on the wafer. Next the wafers are purged with hydrogen or oxygen. After this nitride process is complete, the pressure in the nitride process chamber 104 is checked to see if it matches the pressure of the transfer chamber 110. Once the pressure is matched, the pressure-isolating door 118 is opened and the boat holding the wafers is transferred to the poly process chamber 108 position using transfer system 116.

The pressure in the poly process chamber 108 is matched to the Standard Pressure inside the transfer chamber 110. The servo controlled mechanical transfer moves the boat to the poly process chamber 108. A pressure-isolating door 122 connecting the poly process chamber to the transfer process chamber is opened and the boat holding the wafers is transferred into the poly process chamber. Next the pressure-isolating door 122 is closed and the poly process of depositing high grain size silicon begins. A layer of 700 to 1500 Angstroms is formed on the wafer. After the poly process, the boat holding the wafers is transferred back to the load/unload chamber 102 via the transfer system 116.

It is important to point out that the system 100 described can operate in a batch mode where, several different quartz boats are being moved around sequentially to provide a higher throughput process. Each boat holding the wafers can be exposed to several different processes without the intermediate exposure to ambient air. Using quartz boats, the cooler transfer mechanism never touches the wafers, eliminating thermal shock and reducing particles.

Figure 2:
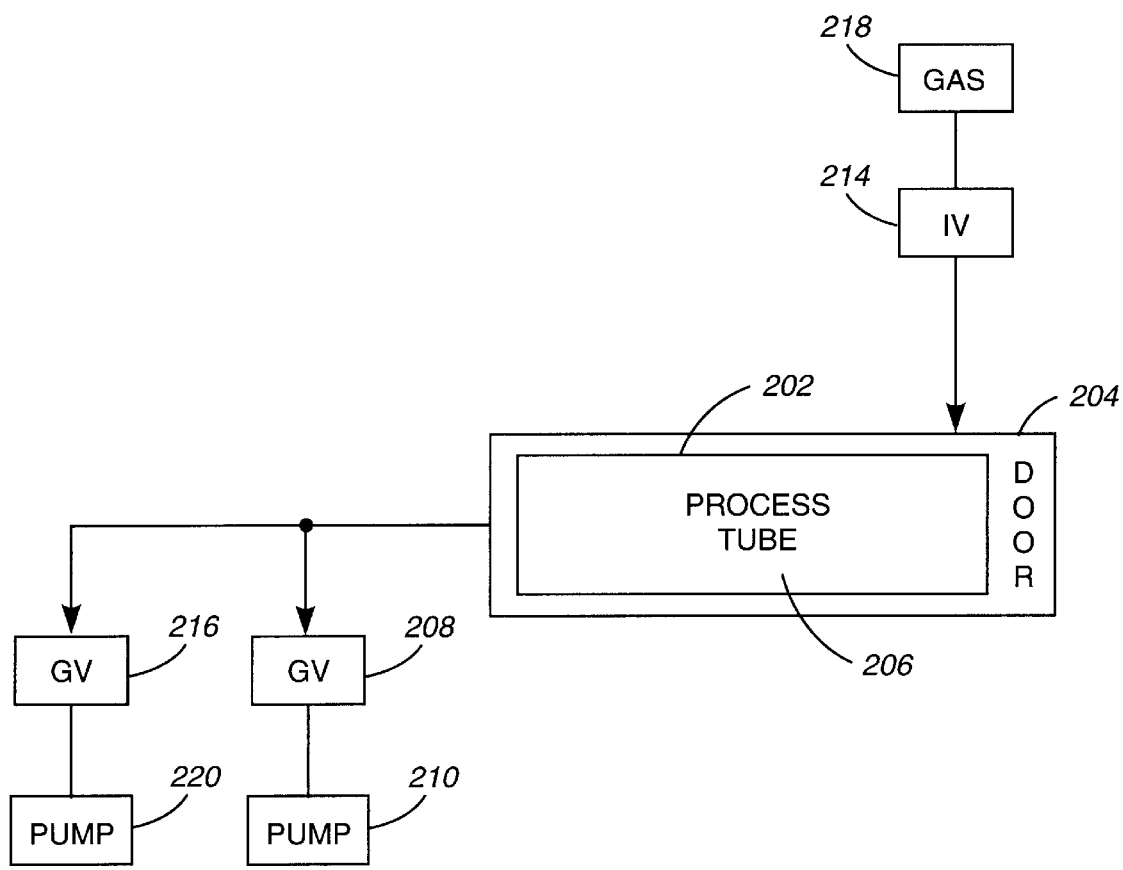
FIG. 2 is a block diagram of one of the processing chambers of the cluster processing system of FIG. 1, according to the present invention.

Referring now to FIG. 2, there is shown a block diagram of one of the processing chambers 200 of the cluster processing system 100 of FIG. 1, according to the present invention. Each processing chamber 206 is a tube suitably sized for processing a batch of wafers. The size of each processing chamber: nitride process chamber 104; oxide process chamber 106; and poly process chamber 108 can be different depending on the requirements for each process step. The inner walls 202 of each process chamber are quartz. The walls of the processing chamber give off or out gas containments from the walls themselves, especially during elevated temperatures and the processing pressures. The use of quartz walled process chambers reduces the possibility of contamination of the wafers during processing. Other walled substances such as a silicon carbide may be used where the problem of out gassing can be kept to a minimum. The pressure isolating door 204 corresponds to one of the doors 118, 120, 122 described above, in reference to FIG. 1, for each process chamber. These pressure isolating doors besides isolating the pressure inside each process chamber from the pressure in the Standard Pressure in the transfer chamber can also isolate the temperature in each chamber as well. The operating temperature of these process chambers—nitride process chamber 104, oxide process chamber 106, and poly process chamber—are isolated from each other so that the operating temperature range of one process chamber is independent of the temperature range of another process chamber. The general operating temperature for each chamber can be between 200 degrees Celsius and 1200 degrees Celsius. Each process chamber is heated using a circular resistor, as used in a furnace tube, to provide more uniform heating as compared with standard heat lamps. In another embodiment, besides matching the pressure between the transfer chamber 110 and one of the processing tubes when transferring a boat of wafers, other environmental variables including temperature are set as well to reduce the possibility of wafer contamination.

The pressure in each process tube 206 can be reduced to the UHV to UUHV range through the opening of gate-valve 208 and Standard Pressure pump 210. The isolation valve 214 is opened to introduce process gas 218 into each process tube 206, which is evacuated through gate valve 216 by the evacuation pump 220. The process gas is matched for the nitride process chamber 104, oxide process chamber 106, and poly process chamber accordingly. The process chamber enables polysilicon deposition, epitaxial silicon growth, dielectric deposition and oxidation for forming an entire gate stack without any exposure to ambient air.

Figure 3:
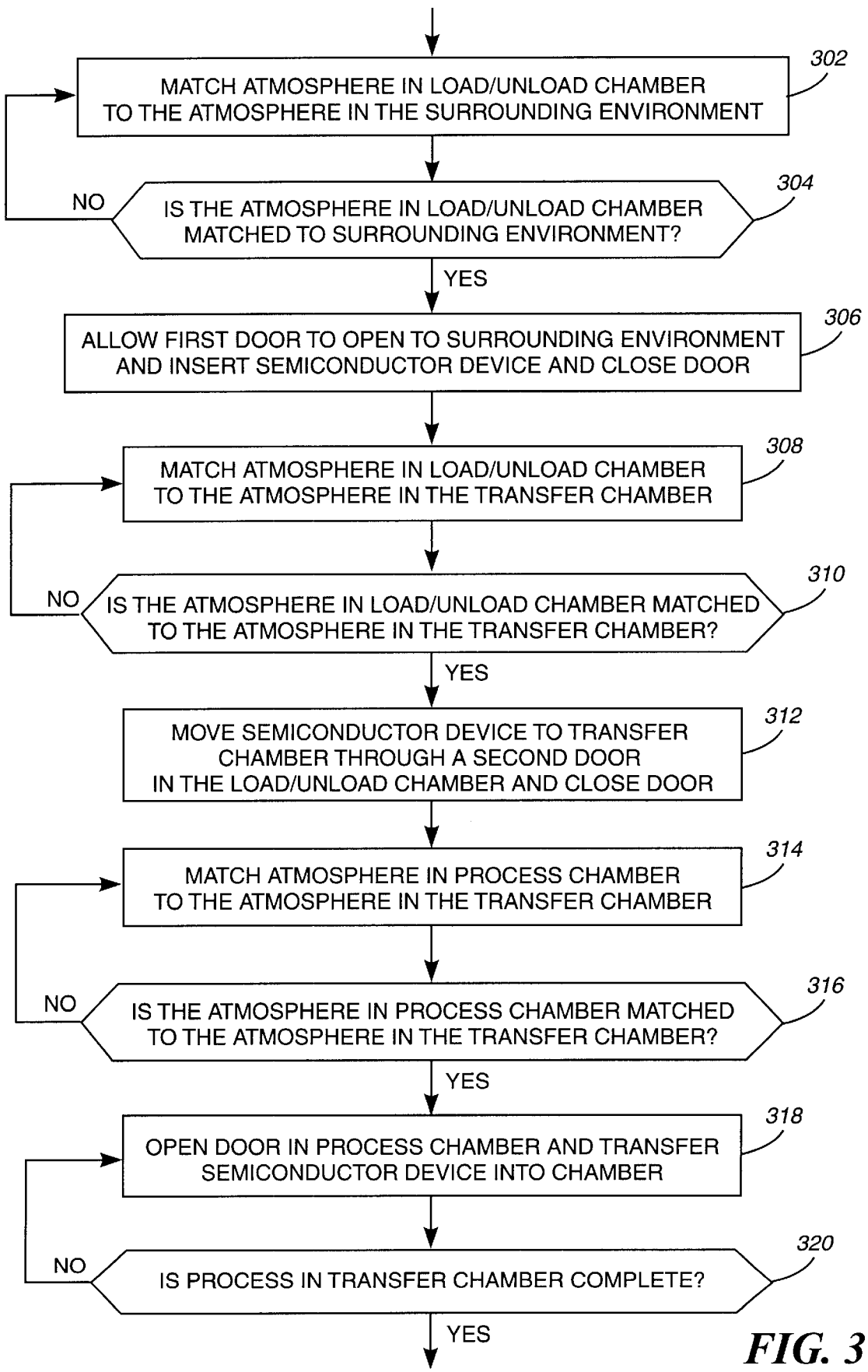
FIG. 3 is a flow diagram of a portion of the process performed in the semiconductor wafer cluster processing system of FIG. 1, according to the present invention.

Turning now to FIG. 3 shown is a flow diagram of a portion of the process performed in the semiconductor wafer cluster processing system of FIG. 1, according to the present invention. This process flow begins with matching the atmosphere (e.g., pressure, temperature and other variables) in the load/unload chamber 102 to the surrounding atmosphere, step 302. Once the atmosphere in the load/unload chamber 102 is matched to the surrounding environment, step 304, a first door 112 is opened to insert the semiconductor device to be processed, step 306. Next the atmosphere in the load/unload chamber 102 is matched to the pressure in the transfer chamber 114. Once the pressure is matched steps 308 and 310, a second door 114 is opened and the semiconductor device is moved into the transfer chamber 114, step 312. The atmosphere in a process chamber. (referring to FIG. 1 this is one of three chambers nitride process chamber 104, oxide chamber 106, or poly process chamber 108) is evacuated to match the atmosphere in the transfer chamber 114, steps 314 and 316. The door corresponding to the process chamber (118, 120, 122) is opened and the semiconductor device inserted into the process chamber, step 318. The semiconductor device undergoes the process in the process chamber. Once the process is complete, step 320, the device can be moved through the transfer chamber 114, when the atmosphere to the process chamber is again matched (not shown) to the transfer chamber to undergo another process or to move to the load/unload chamber 112.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A semiconductor device cluster (Ultra High Vacuum) UHV processing system, comprising:

a transfer chamber defining an internal volume continuously maintainable at a vacuum pressure level of less than or equal to $10^{-8}$ torr, the transfer chamber having a plurality of ports;

a device transfer mechanism inside the transfer chamber for transferring a device between ports;

a plurality of processing tubes each for holding semiconductor devices during processing, each of the tubes being connected to one of the ports of the transfer chamber through a pressure-isolating door for isolating the pressure between the processing tube and the transfer chamber so that the transfer chamber is maintained at the vacuum pressure level of less than or equal to $10^{-8}$ torr; and a load/unload chamber for connecting one of the ports of the transfer chamber to the ambient environment, the load/unload chamber having two pressure isolating doors, the first door for transferring the device between the load/unload chamber and the ambient environment and the second door for transferring the device between the load/unload chamber and the transfer chamber; wherein the two doors of the chamber work cooperatively so that the vacuum pressure inside the load/unload chamber can be matched to approximate the pressure in either: the transfer chamber when the door to the transfer chamber is opened, or the ambient environment when the door to the ambient environment is opened.

2. The processing system as set forth in claim 1, wherein the processing system comprises a mechanism for processing one or more semiconductor wafers.

3. The processing system as set forth in claim 2, wherein the semiconductor device is mounted vertically in a quartz carrier so as to reduce sagging of the device at elevated temperatures.

4. The processing system as set forth in claim 1, wherein the load/unload chamber acts as a treatment chamber for purging hydrogen and oxygen from the devices.

5. The processing system as set forth in claim 1, wherein at least one of the processing tubes further comprises an inner wall constructed from quartz or silicon carbide to reduce out-gassing from the tube to a device being processed in the tube.

6. The apparatus as set forth in claim 1, wherein at least one of the processing tubes further includes a circular resistor coil for providing heating.

7. The processing system as set forth in claim 1, wherein the vacuum pressure level of the transfers chamber is at least a UUHV level.

8. The processing system as set forth in claim 1, including an apparatus for matching the temperature of the process tube to the temperature of the transfer chamber during the insertion or removal of the device in the process tube.

9. An (Ultra High Vacuum) UHV apparatus for processing semiconductor devices while minimizing undesirable contamination of the devices, the apparatus comprising:

a plurality of treatment chambers adapted to apply a process step in the processing of a semiconductor device, wherein each chamber has a vacuum pump and a pressure isolating door for creating a pressure to match a vacuum pressure level of less than or equal to $10^{-8}$ torr;

a transfer chamber for operating at a vacuum pressure level of less than or equal to $10^{-8}$ torr through which at least one device is transferred by way of the pressure-isolating door from one of the treatment chambers so that the transfer chamber is maintained at the vacuum pressure level of less than or equal to $10^{-8}$ torr; and a transport mechanism for transferring the device between the transfer chamber and one or more treatment chambers.

10. The apparatus as set forth in claim 9, further comprising:

a load/unload chamber comprising:
   a pump for lowering the pressure in the load/unload chamber to match the pressure of the transfer chamber; and
   an inner and an outer pressure isolation door, wherein each pressure isolation door is operated cooperatively so that pressure in the load/unload chamber can be matched to the pressure to the surrounding environment when an outer door is open and the pressure inside the load/unload chamber can be matched to that of the transfer chamber when the inner door is opened.

11. The apparatus as set forth in claim 9, wherein the apparatus comprises a mechanism for processing semiconductor wafers.

12. The apparatus as set forth in claim 9, wherein at least one of the treatment chambers further comprises an inner wall made of quartz or silicon carbide.

13. The apparatus as set forth in claim 9, wherein at least one of the processing tubes further includes a circular resistor coil for providing heating.

14. The apparatus as set forth in claim 9, including apparatus for matching the temperature of the treatment chamber is set to the temperature of the transfer chamber during the insertion or removal of the device in the treatment chamber.

* * * * *